(12) United States Patent
Liang

(10) Patent No.: US 9,093,428 B2
(45) Date of Patent: Jul. 28, 2015

(54) THERMAL SHUNT

(75) Inventor: Di Liang, Santa Barbara, CA (US)

(73) Assignee: HEWLETT-PACKARD DEVELOPMENT COMPANY, L.P., Houston, TX (US)

(*) Notice: Subject to any disclaimer, the term of this patent is extended or adjusted under 35 U.S.C. 154(b) by 0 days.

(21) Appl. No.: 14/342,174

(22) PCT Filed: Aug. 31, 2011

(86) PCT No.: PCT/US2011/050083
§ 371 (c)(1),
(2), (4) Date: Feb. 28, 2014

(87) PCT Pub. No.: WO2013/032472
PCT Pub. Date: Mar. 7, 2013

(65) Prior Publication Data
US 2014/0204967 A1  Jul. 24, 2014

(51) Int. Cl.
*H01L 21/00* (2006.01)
*H01L 21/477* (2006.01)
*H01L 27/12* (2006.01)
*H01S 5/024* (2006.01)
*H01S 5/10* (2006.01)
*H01L 29/02* (2006.01)
*H01S 5/02* (2006.01)

(52) U.S. Cl.
CPC .......... *H01L 21/477* (2013.01); *H01L 27/1203* (2013.01); *H01L 29/02* (2013.01); *H01S 5/02461* (2013.01); *H01S 5/02469* (2013.01); *H01S 5/1071* (2013.01); *H01S 5/021* (2013.01)

(58) Field of Classification Search
CPC .... H01L 27/1203; H01L 29/02; H01L 21/477
USPC ............................... 438/26, 31; 257/E33.075
See application file for complete search history.

(56) References Cited

U.S. PATENT DOCUMENTS

| | | | |
|---|---|---|---|
| 6,288,426 B1 * | 9/2001 | Gauthier et al. ............... | 257/347 |
| 6,515,333 B1 | 2/2003 | Riccobente | |
| 7,639,719 B2 | 12/2009 | Fang et al. | |
| 2009/0168821 A1 * | 7/2009 | Fang et al. ...................... | 372/34 |
| 2011/0064099 A1 | 3/2011 | Govorkov et al. | |

OTHER PUBLICATIONS

Delphine Marris-Morini et al., "D006—State of the art on Photonics on CMOS," Nov. 30, 2009, pp. 1-70, Available at: <helios-project.eu/content/download/326/2147/file/HELIOS_D006.pdf>.
G. Morthier et al., "Microdisk Lasers Heterogeneously Integrated on Silicon for Low-Power, High-Speed Optical Switching," Photonics Society Newsletter, Jun. 2010, vol. 24, Issue 3, pp. 5-10, IEEE, Available at: <lecture.ecc.u-tokyo.ac.jp/~tlecwada/Optics%20 &%20Photonics/presentation%20files/paper9.pdf>.

(Continued)

*Primary Examiner* — Brook Kebede
(74) *Attorney, Agent, or Firm* — Hewlett-Packard Patent Department

(57) ABSTRACT

A thermal shunt is to transfer heat from a sidewall of a device to a silicon substrate. The device is associated with a Silicon-On-Insulator (SOI) including a buried oxide layer. The thermal shunt extends through the buried oxide layer to the silicon substrate.

14 Claims, 9 Drawing Sheets

(56) References Cited

OTHER PUBLICATIONS

International Search Report and Written Opinion, May 1, 2012, PCT Patent Application No. PCT/US2011/050083, 7 pages.

Kuldeep Amarnath, "Active Microring and Microdisk Optical Resonators on Indium Phosphide," Dissertation, 2006, pp. 1-163, Available at: <drum.lib.umd.edu/bitstream/1903/3513/1/umi-umd-3343.pdf>.

* cited by examiner

THERMAL SHUNT

CROSS-REFERENCE TO RELATED APPLICATIONS

This application is the National Stage of International Application No. PCT/US11/50083, filed Aug. 31, 2011.

BACKGROUND

A Silicon-On-Insulator (SOI) device may generate heat that can compromise operational performance of the device. As device size/footprint is reduced, heat generation may increase dramatically to the operational detriment of the device.

BRIEF DESCRIPTION OF THE DRAWINGS/FIGURES

The present examples will now be described with reference to the accompanying drawings. In the drawings, like reference numbers may indicate identical or functionally similar elements.

DETAILED DESCRIPTION

A Silicon-On-Insulator (SOI) device may be used in electronics and photonics, e.g., for a laser light source in an optical interconnect. Such devices may generate heat that can compromise the device bandwidth, raise the operating threshold, and can cause the device to require more power to overcome the higher operating threshold due to the heat. A reduction in a size of the device may be associated with operational benefits such as lower operational threshold power and smaller footprint (i.e., higher integration density), but may be associated with additional heat generation. The buried oxide layer may serve as a primary thermal barrier due to extremely poor thermal conductivity, preventing heat from dissipating through the substrate. A thermal impedance may be associated with the device, corresponding to how the device may dissipate/transfer heat. A thermal shunt may be used to enhance heat transfer from the device, reducing thermal impedance and improving operational characteristics of the device.

Figure 1:
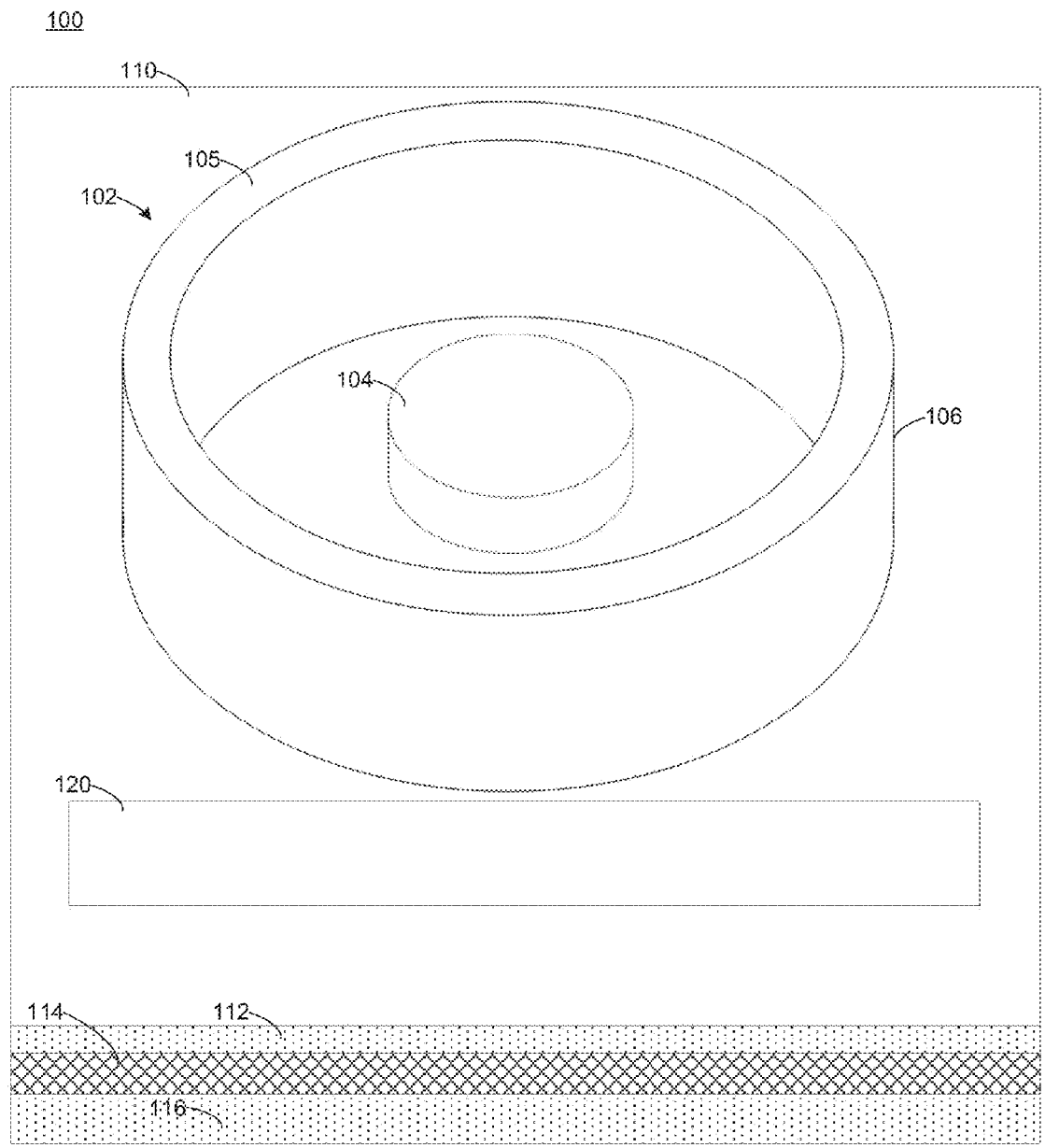
FIG. 1 is a perspective view of a Silicon-On-Insulator (SOI) device according to an example.

FIG. 1 is a perspective view of a Silicon-On-Insulator (SOI) device 100 according to an example. In the illustrated example, device 100 is an optical device (electrically-driven hybrid silicon microring laser) and includes SOI 110, microring 102 bonded to SOI 110, and waveguide 120 defined in the SOI 110 for evanescent coupling with microring 102 to resonate optical modes. SOI 110 includes a silicon device layer 112, buried oxide layer 114, and silicon substrate 116. Microring 102 includes an outer contact 105 and an inner contact 104, which may receive a driving current. Microring 102 also includes a sidewall 106.

Though illustrated in FIG. 1 as a microring laser, device 100 may include other devices such as a distributed Bragg reflector, a distributed feedback laser, and/or a tunable laser. Lasers with resonator geometries may be used as an on-chip light source for photonic integrated circuits (PICs) including photonic data links, and may be used for wavelength division multiplexing (WDM), add-drop filters/routers, switches, sensors, modulators, buffers, and on-chip optical interconnect applications, passive components such as multiplexers and silicon modulators, and active components such as electro-absorption modulators.

Benefits are associated with decreased device dimensions. For example, performance may increase with smaller ring diameter, by shortening a length of the optical resonator cavity and reducing an operational threshold current. A smaller threshold current, and corresponding reduction in power consumption, may be associated with smaller device dimensions and reaching a lasing threshold more efficiently at different wavelengths. Furthermore, smaller device dimensions may result in faster modulation rates and control over lasing wavelengths, for applications such as combining different wavelength signals together for multiplexing. Integration density may also increase with reduced device footprint, leading to enhanced manufacturing efficiency and corresponding unit device cost reduction.

Operation of device 100, e.g., electrically driving inner contact 104 and outer contact 105 with a threshold current, may generate heat, which may degrade operational performance. Reducing the physical dimensions of device 100, e.g., reducing a diameter of microring 102, may be associated with increasing heat generation compared to devices of larger dimensions. Heat may compromise bandwidth performance of microring 102, and may cause microring 102 to have a higher lasing threshold in the presence of heat, thereby requiring more power to reach the operational threshold. Device 100 may be associated with a thermal impedance determined by the device serial resistance. This serial resistance may be directly related to the dimensions of the device 100, associated with an ability of device 100 to dissipate heat. Temperature may rise in an active region of device 100 when active, e.g., driven at continuous-wave current, and may increase quadratically as a function of device diameter. In an example, a temperature increase in a device active region may be 2.5 degrees Centigrade (C.) for a device having a diameter of 50 micrometers (μm). In another example, a device having a relatively smaller diameter of 15 μm may have a temperature increase in the active region of 63 degrees C. Example thermal impedances for devices of 50 μm, 25 μm, and 15 μm diameters may be 465.2 degrees C. per Watt (W), 1253.4 degrees C./W, and 1782 degrees C./W. A device that generates excessive heat may be limited to operation in pulsed mode to allow the device to cool between pulses, to avoid excessive operational degradation from heat during operation.

Heat may dissipate through surface radiation, convection (gas and/or fluid cooling), and diffusion through, e.g., SOI 110. Although silicon may transfer heat (e.g., silicon device layer 112 and silicon substrate 116), the buried oxide layer 114 of SOI 110 acts as a thermal insulator. For example, silicon may have a thermal conductivity of 130 W/m/degree C., in contrast to silicon oxide (e.g., the buried oxide layer 114, which may be SiO$_2$) having a thermal conductivity of only 1.3 W/m/degree C. Thus, diffusion of heat from microring 102 through SOI 110 may be limited by the buried oxide layer 114 and its low thermal conductivity.

Accordingly, examples herein may use a thermal shunt to transfer heat from sidewall 106 through buried oxide layer 114 to silicon substrate 116. Using thermal shunts to mitigate potential cavity temperature rises may allow devices having very low operational thresholds and very low power consumption compared to similar devices generating high temperatures and lacking thermal shunts.

Microring 102 may operate with a narrow waveguide 120, such that thermal shunts may be placed very close to microring 102 to reach hotspots in the microring 102 (e.g., in contrast to linear lasers or other optical devices associated with wide waveguide structures preventing close proximity of a shunt to a device hot spot). Devices based on the examples herein may enable placement of thermal shunts in proximity to a sidewall 106 of the device to remove heat from device hotspots through the sidewall 106.

Figure 2:
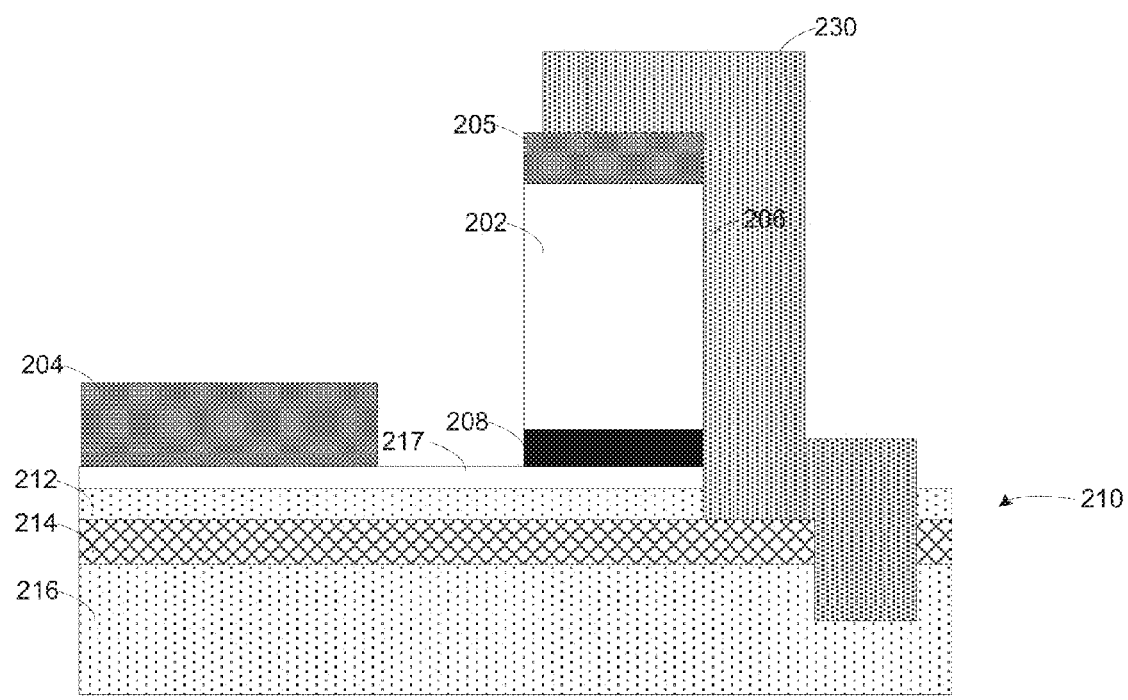
FIG. 2 is a sectional side view of a Silicon-On-Insulator (SOI) device according to an example.

FIG. 2 is a sectional side view of a Silicon-On-Insulator (SOI) device 200 including a thermal shunt 230 according to an example. Microring 202 is bonded to silicon device layer 212 of SOI 210. SOI 210 includes buried oxide (BOX) layer 214 sandwiched between the silicon device layer 212 and silicon substrate 216. The thermal shunt 230 may be in contact with sidewall 206 of the microring 202. Microring 202 includes an inner contact 204, an outer contact 205, contact layer 217, and an active layer 208 that may generate heat ("hotspot(s)") during operation of the device 200.

Thermal shunt 230 in FIG. 2 may be a non-metal, such as aluminum oxide (e.g., Al$_2$O$_3$) that may serve as a dielectric. Thus, in contrast to a metal thermal shunt directly in contact with sidewall 206, the dielectric thermal shunt 230 does not cause optical loss in the microring 202, and may be placed in contact with sidewall 206 and a carrier recombination/active region 208 where the temperature may be the highest, providing effective heat extraction from the sidewall 206 of the device 200.

The dielectric material of thermal shunt 230 may avoid a need for complicated processing steps, such as high-temperature annealing, fine polishing, low tolerances, and the like, that would be associated with other materials like poly-silicon and metal. Aluminum oxide has a thermal conductivity of 25-40 W/m/degree C., which may provide effective operation as a thermal shunt, in contrast to other materials with lower thermal conductivity (e.g., silicon oxide). Aluminum oxide, therefore, has thermal and insulating (e.g., optical, electrical, etc.) properties that enable it to serve as cladding material and thermal shunt material simultaneously. For example, thermal shunt 230 may be used for surface dangling bond passivation (e.g., passivation of etched surfaces), enhancing operational efficiency and preventing surface degradation of the device 200. Thus, thermal shunt 230 may provide multiple enhancements to improve device performance, including enhancements beyond heat removal (e.g., passivation, adjustment of resonated optical modes, and so on). Additionally, thermal shunt 230 has a negligible footprint, allowing dense integration of device 200 and thermal shunt 230 with other devices/thermal shunts. Fabrication is straightforward, as a thermal shunt 230 may be fabricated based on a standard lift-off photolithography, etch, and dielectric deposition step without any additional fabrication complications such as polishing for strict tolerances.

Figure 3:
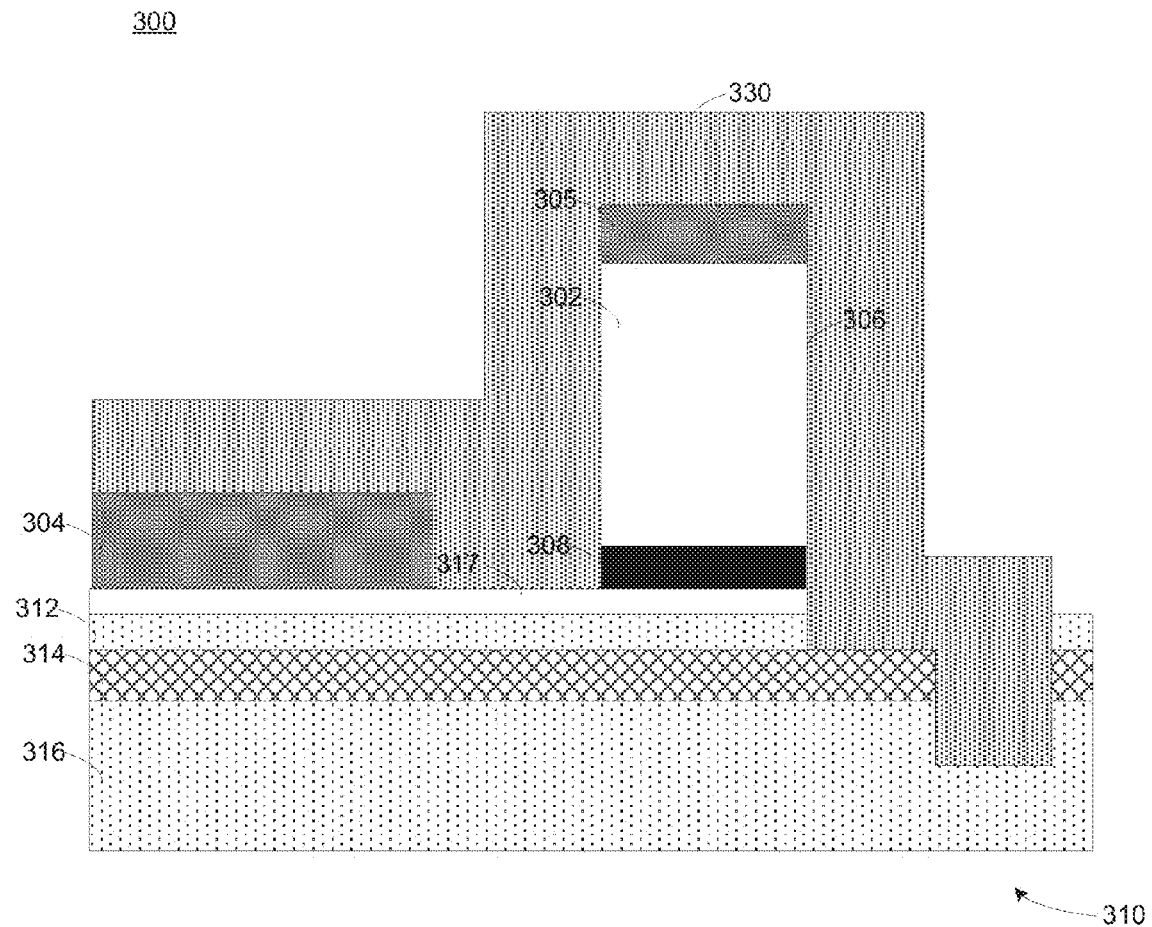
FIG. 3 is a sectional side view of a Silicon-On-Insulator (SOI) device according to an example.

FIG. 3 is a sectional side view of a Silicon-On-Insulator (SOI) device 300 according to an example. Microring 302 is bonded to silicon device layer 312 of SOI 310, which also includes buried oxide (BOX) layer 314 and silicon substrate 316. The thermal shunt 330 is in contact with sidewall 306 of the microring 302, and is also in contact with inner contact 304, contact layer 317, outer contact 305, active layer 308, and an inner cavity of the microring 302.

Thermal shunt 330 may encapsulate and/or passivate the microring 302, providing protection to the microring 302 while ensuring efficient heat transfer to the silicon substrate 316 and simultaneously allowing heat dissipating through surface radiation and convection. Thus, thermal shunt 330 provides enhanced heat dissipation/removal for the entirety of the device 300, even while encapsulating and protecting the device 300 (e.g., in contrast to other passivation materials that may hinder efficient heat dissipation through surface radiation and convection). Thermal shunt 330 may be optically and/or electrically insulating, thereby contacting sidewall 306 without interfering with optical operations, and contacting inner contact 304 and outer contact 305 without interfering with electrical operations. Vias and/or trenches may be used to provide an electrical connection through thermal shunt 330 to the contacts. A metal thermal shunt 330 may be used, by incorporating a dielectric shunt portion into the thermal shunt 330 to thermally couple and electrically and/or optically isolate the metal portion of the thermal shunt 330 from underlying devices that may be affected by contact and/or close proximity of metal.

Figure 4:
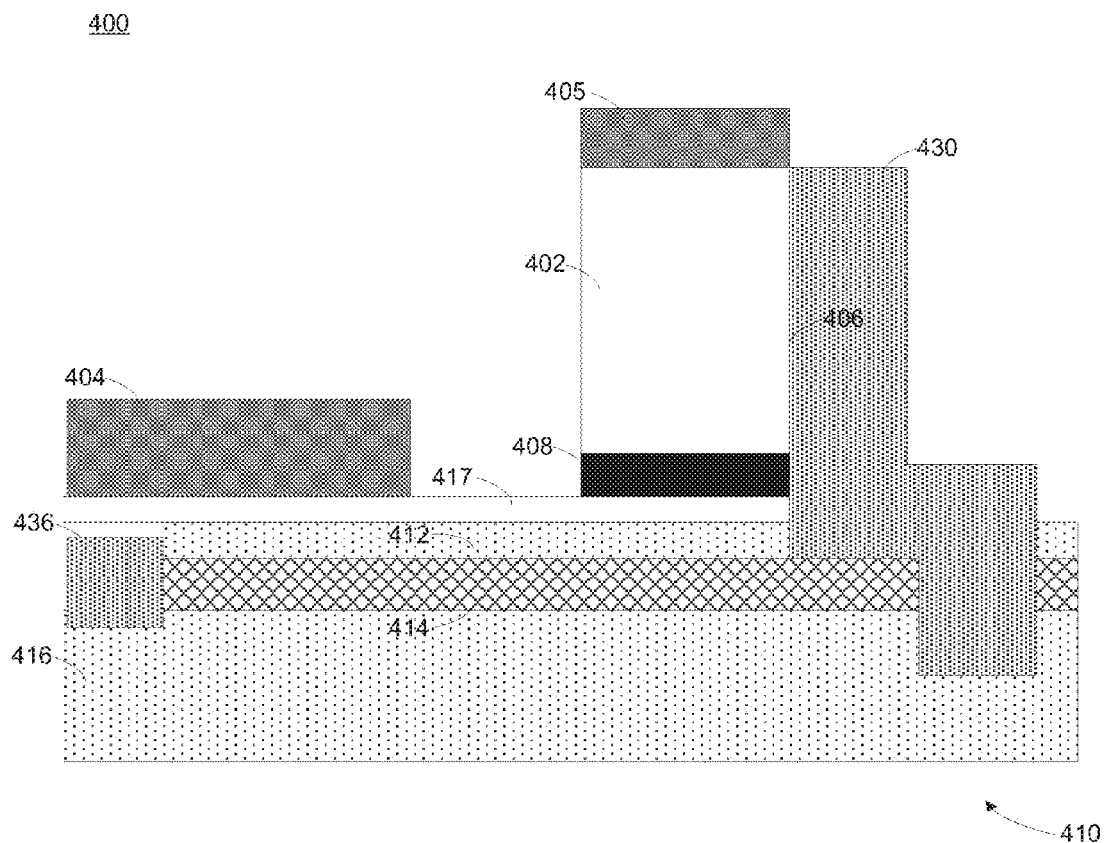
FIG. 4 is a sectional side view of a Silicon-On-Insulator (SOI) device according to an example.

FIG. 4 is a sectional side view of a Silicon-On-Insulator (SOI) device 400 according to an example. Microring 402 is bonded to silicon device layer 412 of SOI 410, which also includes buried oxide (BOX) layer 414 and silicon substrate 416. The thermal shunt 430 is in contact with sidewall 406 and active layer 408 of the microring 402, and exposes inner contact 404, contact layer 417, outer contact 405, and an inner cavity of the microring 402. Device 400 also includes a thermal substrate shunt 436, in contact with silicon device layer 412 and silicon substrate 416.

Thermal substrate shunt 436 may be positioned underneath and within the lateral dimensions of microring 402. Thermal substrate shunt 436 may be composed of material having a high thermal conductivity, such as aluminum oxide, gold, or other metal or dielectric materials, to fill up a hole etched through the BOX layer 414. Thermal substrate shunt 436 may contact at least a portion of silicon device layer 412, such that heat from silicon device layer 412 may be extracted down to the silicon substrate 416.

As illustrated in FIG. 4, the thermal substrate shunt 436 may rise vertically to a level below the top surface of the silicon device layer 412. Accordingly, it is possible to control the fill rate of the thermal substrate shunt 436, and deposit thermal substrate shunt 436 without having to polish the top surface of the thermal substrate shunt 436 and SOI 410.

Figure 5:
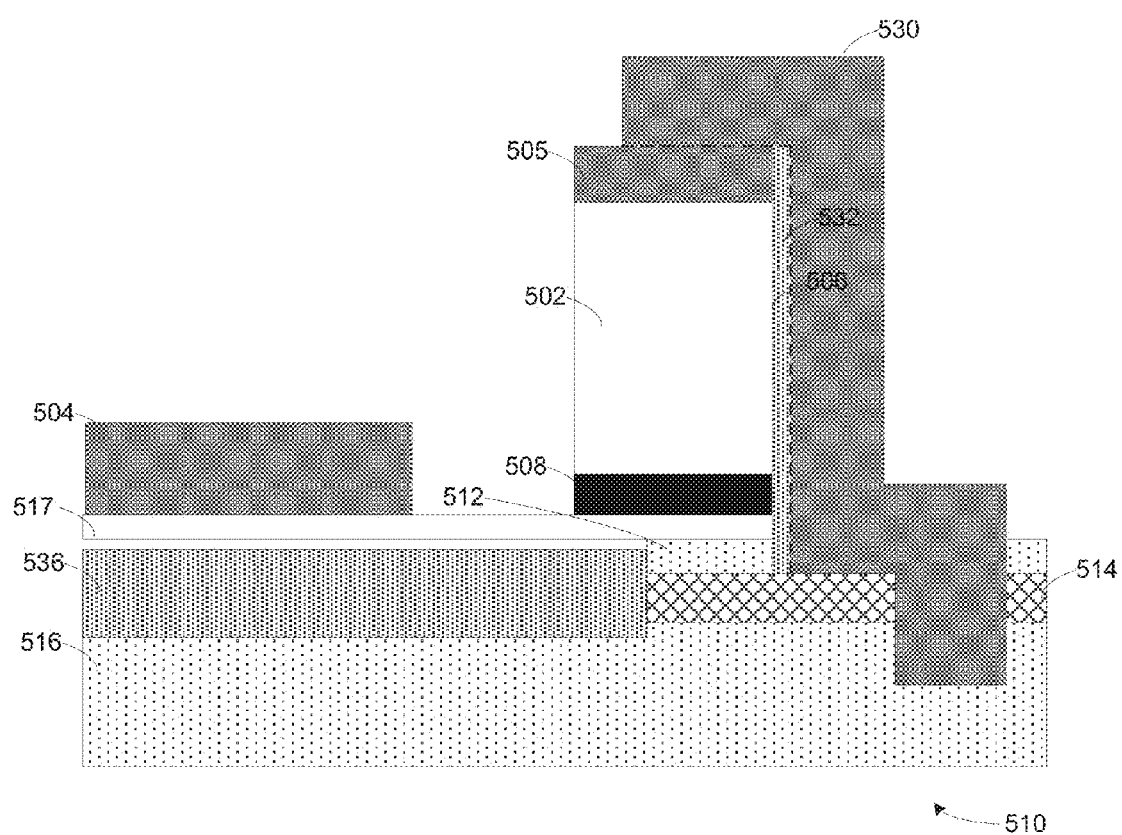
FIG. 5 is a sectional side view of a Silicon-On-Insulator (SOI) device according to an example.

FIG. 5 is a sectional side view of a Silicon-On-Insulator (SOI) device 500 according to an example. Microring 502 is bonded to silicon device layer 512 of SOI 510, which also includes buried oxide (BOX) layer 514 and silicon substrate 516. The thermal shunt 530 may be metal and may include a dielectric shunt 532 in contact with sidewall 506 and active layer 508 of the microring 502. Device 500 includes inner contact 504, contact layer 517, and outer contact 505. Thermal shunt 530 is in contact with outer contact 505, and may be formed of the same material, e.g., as one unitary contact/shunt component. Device 500 also includes a thermal substrate shunt 536, in contact with silicon device layer 512 and silicon substrate 516.

The dielectric shunt 532 may form part of the thermal shunt 530, and may form a dielectric layer between semiconductor material of the microring 502 and metal (e.g., gold, aluminum and copper) of the thermal shunt 530. Thus, dielectric shunt 532 may prevent optical modes, associated with the microring 502, being optically absorbed by the metal and/or proximity of thermal shunt 530. Thermal shunt 530 may be made of the same material as inner contact 504 and/or outer contact 505 (e.g., gold, aluminum and copper). Due to large refractive index contrast between semiconductors and dielectrics such as $SiO_2$ and/or $Al_2O_3$, optical mode(s) may be well-confined inside the semiconductors by the dielectric shunt 532, even when a metal thermal shunt 530 is in proximity to the sidewall 506. A thickness of the dielectric shunt 532, spanning the distance from the hottest point in the device structure to the thermal shunt 530, therefore may be as thin as 300 nm without additional optical absorption loss from the metal thermal shunt 530. Such dimensions may be very favorable to heat extraction from the microring 502. The dielectric shunt 532 has low optical loss to prevent effects to the optical properties of the resonating microring 502. The dielectric shunt 532 also has a high thermal conductivity to enable quick and efficient heat transfer from sidewall 506 of the microring 502 to the metal thermal shunt 530 to the silicon substrate 516.

The thermal substrate shunt 536 may be disposed in the SOI 510, to transfer heat from the silicon device layer 512 to the silicon substrate 516. The thermal substrate shunt 536 may be extended laterally, as shown in the illustrated example of FIG. 5, towards an inner edge of the microring 502 (e.g., to an edge of the resonator) to absorb, attenuate, and/or suppress higher order lateral optical modes. Accordingly, the resonator can effectively operate as a single mode resonator, such that positioning of the thermal substrate shunt 536 may enhance device performance based on resonator mode operation, in addition to enhancing heat removal from the silicon device layer 512. Additionally, the thermal substrate shunt 536 may be spaced from contact layer 517, as the dimensions, structure and/or other features of the device 500 and/or thermal substrate shunt 530 enable flexibility with structural support and spacing for the microring 502 and related structures.

Figure 6:
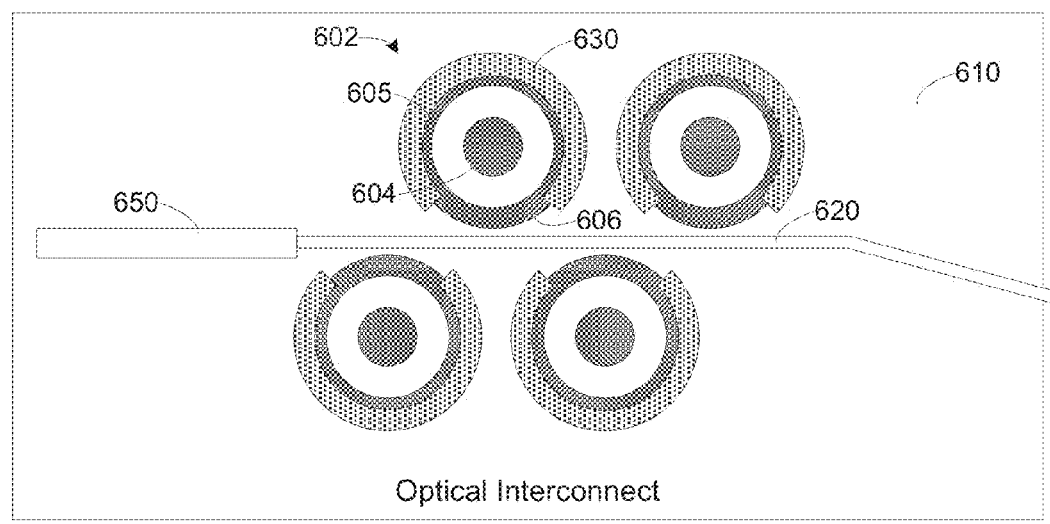
FIG. 6 is an overhead view of an optical interconnect according to an example.

FIG. 6 is an overhead view of an optical interconnect 600 according to an example. Optical interconnect 600 may include multiple microrings 602, a waveguide 620, and a photodetector 650 disposed on SOI 610. A microring 602 may produce its own signal, and one channel may be assigned to one ring laser and another to another ring laser, and so on. Microring 602 includes an inner contact 604, outer contact 605, and thermal shunt 630 in contact with a sidewall 606 of the microring 602. As shown in the overhead view of FIG. 6, thermal shunt 630 may wrap around microring 602, and may wrap around a portion of and/or the entire circumference of microring 602, while extracting heat from the sidewall 606.

Microrings 602 may share the waveguide 620, thereby multiplexing signals associated with the microrings 602 together to get a multi-wavelength laser to be used in the optical interconnect 600. A multiplexor based on the microring example of FIG. 6 may have fewer components compared to linear lasers that impose optical loss and a larger footprint, while using a greater number of components, compared to the example of FIG. 6.

Photodetector 650 may be integrated with the waveguide 620. In an example, a taper-shaped photodetector having a length of approximately 180 microns may adiabatically transform the optical mode from a passive SOI waveguide 620 to a hybrid waveguide detector 650 with low coupling loss and small reflection.

An optical interconnect 600 may enable power-efficient and high-speed silicon-based processors, such as engines for optical interconnect systems. Such systems, including photonic data links, may increase bandwidth and decrease power consumption in comparison to, e.g., CMOS chips using conventional metal interconnects.

Optical interconnect 600, based on compact microring design, may replace lasers, modulators, and multiplexors in other optical systems such as the Intel LightPeak™ II system, while providing a reduction in area (and cost) of approximately a factor of 40 and a reduction in energy dissipated per bit of approximately a factor of 4 and an enhancement in data rate of 2. For example, rather than using a separate laser sources, modulators, and multiplexor as in the LightPeak™ II system, a system based on FIG. 6 can generate light, perform Wavelength Division Multiplexing (WDM) bringing multiple microrings (light sources) together, and directly modulate the multiple microrings to very high speeds. Thus, the optical interconnect 600 of FIG. 6 may directly encode signals using reduced power and size/device footprint characteristics compared to other systems.

FIGS. 7A-7E are sectional side views of Silicon-On-Insulator (SOI) device fabrication according to an example. The example device shown in FIGS. 7A-7E may be an electronic device structure (e.g., a transistor) and/or SOI waveguide photonic device structure (e.g., straight optical resonator, bend optical resonator, ring optical resonator, and the like), and may be a non-hybrid structure formed on a substrate, including electronic and photonic devices that may include a waveguiding structure.

Figure 7A:
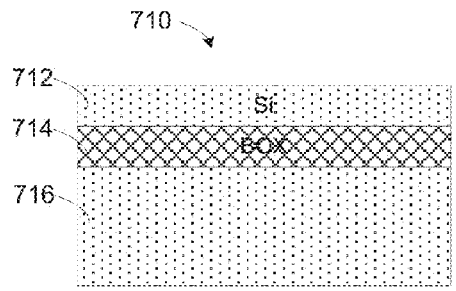
FIGS. 7A-7E are sectional side views of Silicon-On-Insulator (SOI) device fabrication according to an example.
Figure 7B:
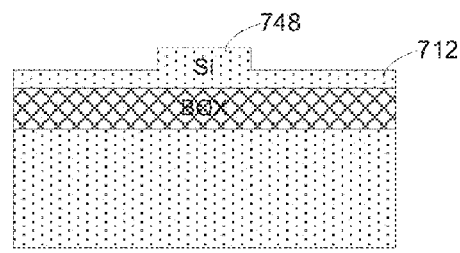
Figure 7C:
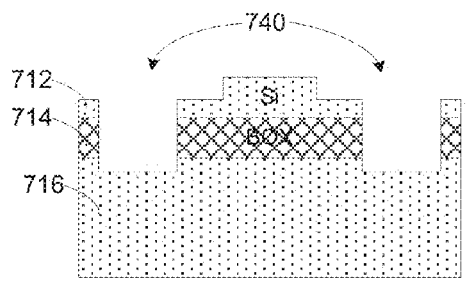
Figure 7D:
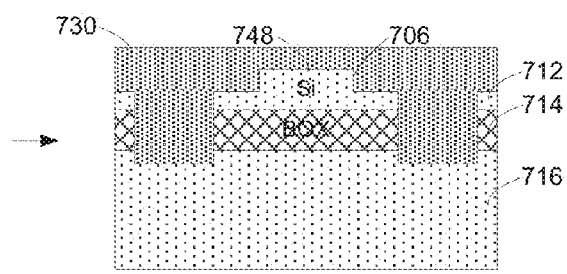
Figure 7E:
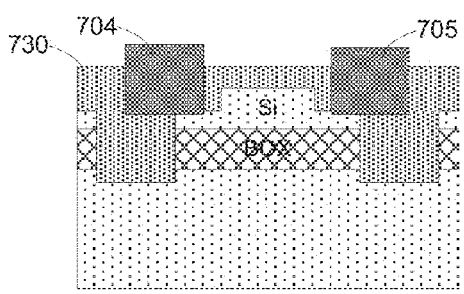

FIG. 7A illustrates SOI 710 including a silicon device layer 712, buried oxide (BOX) layer 714, and silicon substrate 716. FIG. 7B illustrates removal of a portion of the silicon device layer 712 to provide a mesa 748. FIG. 7C illustrates removal of a portion of silicon device layer 712, BOX layer 714, and silicon substrate 716 to form trenches 740. FIG. 7D illustrates deposition of thermal shunt 730. Thermal shunt 730 may be optically low-loss, highly thermal conductive material (e.g., diamond, aluminum oxide, and the like, including other dielectrics). Thermal shunt 730 also may be electrically insulating. Thermal shunt may contact a sidewall 706 of mesa 748, and may extend through the silicon device layer 712 and BOX layer 714 to contact and transfer heat from the sidewall 706 to the silicon substrate 716. FIG. 7E illustrates etching trenches in thermal shunt 730 and deposition of the inner contact 704 and outer contact 705. Inner contact 704 and outer contact 705 may be electrically conductive, e.g., metal such as gold.

Figure 8A:
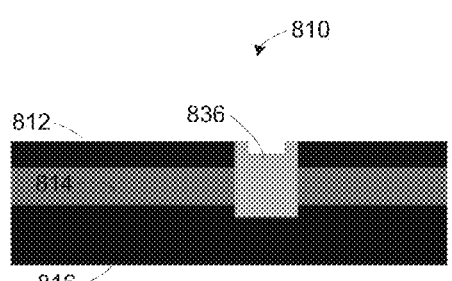
FIGS. 8A-8F are sectional side views of Silicon-On-Insulator (SOI) device fabrication according to an example.

FIGS. 8A-8F are sectional side views of Silicon-On-Insulator (SOI) device fabrication according to an example. FIG. 8A illustrates SOI 810 including silicon device layer 812, buried oxide (BOX) layer 814, and silicon substrate 816. The layers of the SOI 810 may be selectively removed (e.g., patterning, etching, liftoff, and the like) such that thermal substrate shunt 836 may be deposited in the SOI 810. The thermal substrate shunt 836 may contact the device layer 812 to transfer heat from the device layer 812 through the BOX layer 814 to the silicon substrate 816. FIGS. 8A-8F illustrate a hybrid structure, including a device 802 that may include a structure of III-V materials that may be bonded to a substrate (e.g., device 802 bonded to SOI 810 to form a hybrid device, in contrast to the non-hybrid devices shown in FIGS. 7A-7E that may be formed from a unitary substrate).

A top surface of the thermal substrate shunt 836 may be offset vertically from a top surface of the silicon device layer 812. Furthermore, a top surface of the thermal substrate shunt 836 does not need to be polished to strict tolerances (that may be associated with other hybrid devices where bonding is involved). For thermal substrate shunt 836, the heat in the silicon device layer 812 may be extracted to the silicon substrate 816 efficiently based on the deposited material (e.g., aluminum oxide) of the thermal substrate shunt 836 reaching the silicon device layer 812. Thus, thermal substrate shunt 816 may be deposited within a relaxed range of tolerances. Thus, such no fine polishing step is needed in step FIG. 8A regarding a top surface of SOI 810, reducing fabrication complexity. Furthermore, thermal substrate shunt 836 may be positioned such that it does not provide structural support to a device 802 to be bonded to a top surface of the SOI 810. Thus, there is greater tolerance for a vertical offset between the top of the thermal substrate shunt 836 and the top of the silicon device layer 812. Inner hole liftoff may be used regarding the thermal substrate shunt 836.

Figure 8B:
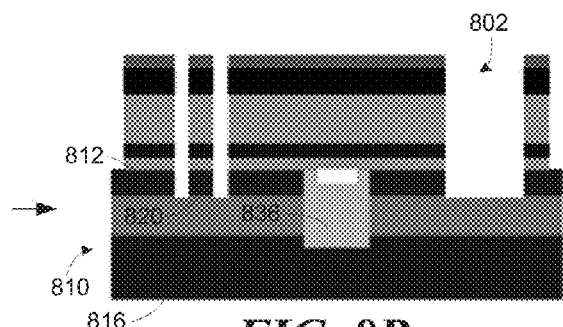

FIG. 8B illustrates bonding of microring 802 to silicon device layer 812. A bus waveguide 820 may be prepared in silicon device layer 812 based on electron beam lithography and/or dry etches affecting silicon device layer 812. The device 802 (e.g., a microring) may include III-V gain epitaxial layers that may be transferred to the SOI 810 through high-quality wafer bonding. An example III-V epitaxial structure for device 802 may include periods of InAlGaAs-based quantum wells plus a p-doped 50 nm-thick InAlGaAs separate confinement heterostructure (SCH) layer sandwiched by a 110 nm-thick n-doped InP contact layer and a p-doped 1.5 μm-thick InP cladding layer. This structure may be bonded on top of SOI 810 to a 350 nm-thick silicon device layer 812. A cavity may exist between thermal substrate shunt 836 and device 802, as device 802 does not rely on thermal substrate shunt 836 for structural support and heat may be transferred by thermal substrate shunt 836 to the silicon substrate 816 even if a top surface of thermal substrate shunt 836 is not flush with a top surface of the silicon device layer 812.

Figure 8C:
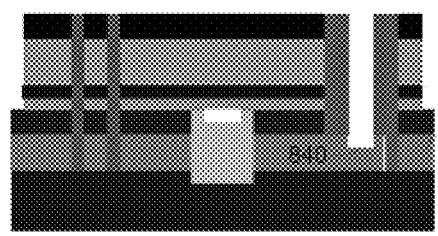

FIG. 8C illustrates patterning and dry etching through the BOX layer 814. For example, a buried oxide (BOX) trench 840 may be etched to prepare BOX layer 814 for deposition of a thermal shunt.

Figure 8D:
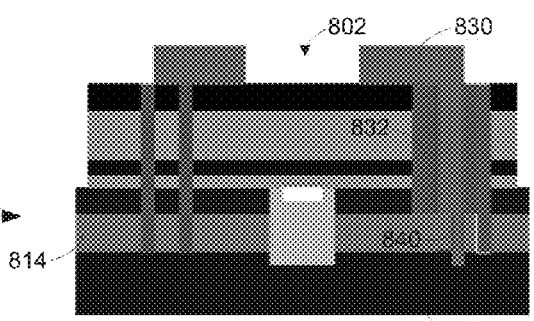

FIG. 8D illustrates liftoff of thermal shunt 830, and patterning for an inner cavity of device 802. Thermal shunt 830 may be made of a dielectric (e.g., aluminum oxide), and may be made of a metal including a dielectric shunt 832. The BOX trench 840 extends through BOX layer 814 and into silicon substrate 816.

Figure 8E:
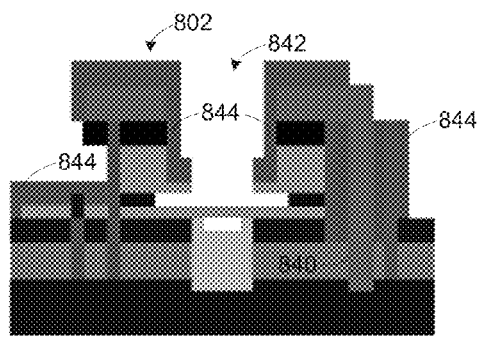

FIG. 8E illustrates dry etch, passivation, and micromachined quantum well (MQW) wet etching. An inner device trench 842 is developed in the device 802, and BOX trench 840 is extended to allow efficient thermal transfer. Passivation 844 is applied to outer surfaces, e.g., etched semiconductor surfaces, to protect the device 802 and various components.

Figure 8F:
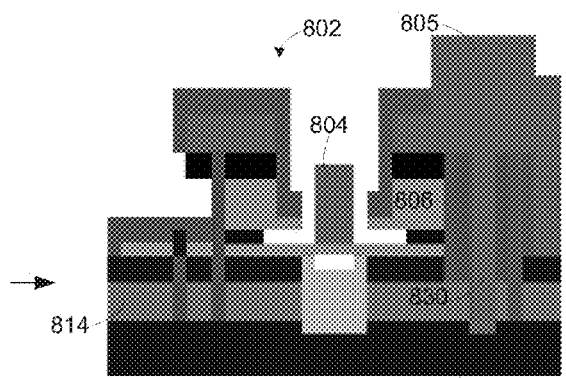

FIG. 8F illustrates liftoff of inner contact 804 and outer contact 805. Final probepad lithography is also applied. Thus, device 802 is fabricated, including thermal shunt 830 to transfer heat from a sidewall 806 of device 802 through the BOX layer 814 to the silicon substrate 816.

Figure 9:
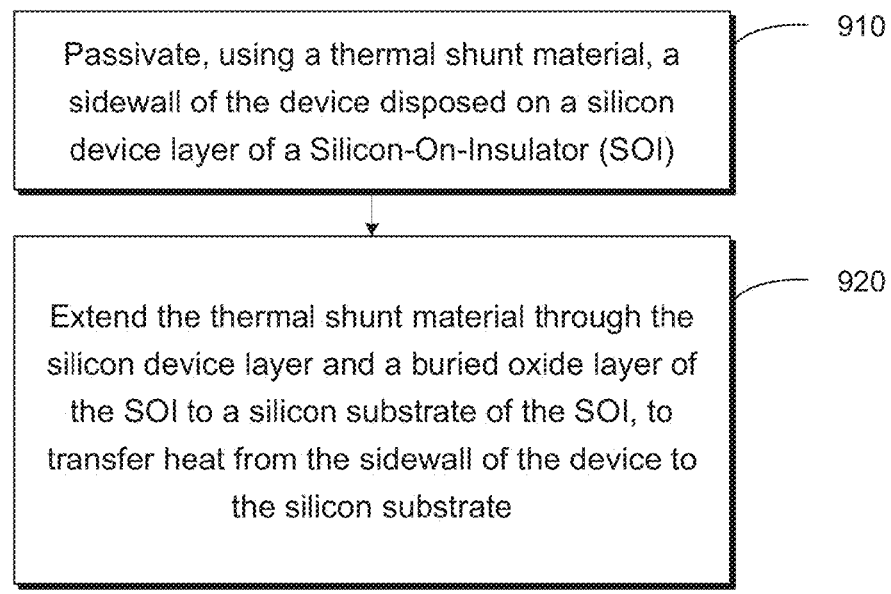
FIG. 9 is a flow chart based on a method of transferring heat from a Silicon-On-Insulator (SOI) device according to an example.

FIG. 9 is a flow chart based on a method of transferring heat from a Silicon-On-Insulator (SOI) device according to an example. In step 910, a sidewall of the device is passivated using a thermal shunt material. The device is disposed on a silicon device layer of a SOI. In step 920, the thermal shunt material is extended through the silicon device layer and a buried oxide layer of the SOI to a silicon substrate of the SOI, to transfer heat from the sidewall of the device to the silicon substrate. Thus, the thermal shunt may provide passivation and efficient heat transfer from the sidewall of the device.

The breadth and scope of the present invention should not be limited by any of the above-described examples, but should be defined in accordance with the following claims and their equivalents.

What is claimed is:

1. A Silicon-On-Insulator (SOI) device, comprising:
 a sidewall disposed on a silicon device layer of the SOI, wherein the SOI includes a buried oxide layer sandwiched between the silicon device layer and a silicon substrate; and
 a thermal shunt to contact the sidewall of the device and extend through the silicon device layer and buried oxide layer to the silicon substrate to transfer heat from the sidewall of the device to the silicon substrate, wherein the thermal shunt is electrically insulating.

2. The device of claim 1, wherein the thermal shunt is composed of a dielectric to contact the device for surface dangling bond passivation.

3. The device of claim 1, further comprising a thermal substrate shunt, laterally displaced from the thermal shunt, to extend through the buried oxide layer to transfer heat from the silicon device layer through the buried oxide layer to the silicon substrate.

4. The device of claim 3, wherein a top surface of the thermal substrate shunt is offset below a top surface of the silicon device layer.

5. An optical interconnect comprising:
 a photon generator bonded to a silicon device layer of a Silicon-On-Insulator (SOI) to resonate optical modes;
 a buried oxide layer sandwiched between the silicon device layer and a silicon substrate; and
 a thermal shunt to extend from the photon generator through the silicon device layer and the buried oxide layer to the silicon substrate, wherein the thermal shunt is proximate to a sidewall of the photon generator to transfer heat from the sidewall and substantially confine the resonated optical modes within the photon generator.

6. The optical interconnect of claim 5, wherein the thermal shunt is thermally conductive and associated with an optical loss characteristic to substantially confine the resonated optical modes within the photon generator.

7. The optical interconnect of claim 5, wherein the thermal shunt is diamond.

8. The optical interconnect of claim 5, wherein the thermal shunt is aluminum oxide.

9. The optical interconnect of claim 5, further comprising a waveguide to resonate optical modes.

10. A method of transferring heat from a Silicon-On-Insulator (SOI) device, comprising:
 passivating, using a thermal shunt material, an etched sidewall of the device disposed on a silicon device layer of a Silicon-On-Insulator (SOI); and
 extending the thermal shunt material through the silicon device layer and a buried oxide layer of the SOI to a silicon substrate of the SOI, to transfer heat from the sidewall of the device to the silicon substrate, wherein the thermal shunt is electrically insulating.

11. The method of claim 10, further comprising generating photons using the device.

12. The method of claim 10, further comprising electrically insulating sidewall of the device using the thermal shunt material.

13. The method of claim 12, further comprising laterally offsetting the thermal substrate shunt relative to the sidewall to attenuate higher order modes of the device.

14. The method of claim 10, further comprising extending a thermal substrate shunt through the silicon device layer and the buried oxide layer to transfer heat from the silicon device layer through the buried oxide layer to the silicon substrate.

* * * * *

UNITED STATES PATENT AND TRADEMARK OFFICE
CERTIFICATE OF CORRECTION

PATENT NO. : 9,093,428 B2  
APPLICATION NO. : 14/342174  
DATED : July 28, 2015  
INVENTOR(S) : Liang Page 1 of 1

It is certified that error appears in the above-identified patent and that said Letters Patent is hereby corrected as shown below:

In the claims

Column 8, line 57, Claim 12, delete "insulating" and insert -- insulating the --, therefor.

Signed and Sealed this
Twenty-second Day of December, 2015

Michelle K. Lee
*Director of the United States Patent and Trademark Office*